(12) United States Patent
Chang et al.

(10) Patent No.: US 7,675,439 B2
(45) Date of Patent: Mar. 9, 2010

(54) SERIAL/PARALLEL DATA CONVERSION APPARATUS AND METHOD THEREOF

(75) Inventors: Ching Yen Chang, Hsinchu (TW); Wen-Bin Wang, Shengang Township, Changhua County (TW)

(73) Assignee: Altek Corporation, Hsinchu (TW)

( * ) Notice: Subject to any disclaimer, the term of this patent is extended or adjusted under 35 U.S.C. 154(b) by 8 days.

(21) Appl. No.: 12/230,188

(22) Filed: Aug. 26, 2008

(65) Prior Publication Data

US 2009/0167572 A1 Jul. 2, 2009

(30) Foreign Application Priority Data

Dec. 26, 2007 (TW) .............................. 96150281 A

(51) Int. Cl.
*H03M 9/00* (2006.01)

(52) U.S. Cl. ...................... 341/100; 341/101

(58) Field of Classification Search ............... 341/100, 341/101

See application file for complete search history.

(56) References Cited

U.S. PATENT DOCUMENTS

| | | | | |
|---|---|---|---|---|
| 4,393,301 A | * | 7/1983 | Svendsen | 377/56 |
| 5,223,833 A | * | 6/1993 | Akata | 341/100 |
| 5,561,423 A | * | 10/1996 | Morisaki | 341/100 |
| 5,774,079 A | * | 6/1998 | Zirngibl | 341/100 |
| 6,020,770 A | * | 2/2000 | Madsen et al. | 327/117 |
| 6,184,808 B1 | * | 2/2001 | Nakamura | 341/95 |
| 6,198,415 B1 | * | 3/2001 | Yoshikawa et al. | 341/100 |
| 6,259,387 B1 | * | 7/2001 | Fukazawa | 341/100 |
| 6,768,431 B2 | * | 7/2004 | Chiang | 341/100 |
| 7,320,097 B2 | * | 1/2008 | Ishiyama | 714/726 |
| 7,515,075 B1 | * | 4/2009 | Wallner et al. | 341/100 |
| 7,605,726 B2 | * | 10/2009 | Byeon | 341/100 |
| 2004/0222826 A1 | * | 11/2004 | Takeuchi et al. | 327/123 |

* cited by examiner

*Primary Examiner*—Linh V Nguyen
(74) *Attorney, Agent, or Firm*—Rosenberg, Klein & Lee

(57) ABSTRACT

A serial/parallel data conversion apparatus and a method thereof are used to convert serial data into parallel data by a delay pulse and three stage registers, wherein the device includes a first data register, a second data register, a third data register, a frequency divider and a delay controller. Moreover, the first data register converts the serial data into the parallel data according to a first working clock signal. The frequency divider performs a frequency division for the first working clock signal for producing a second working clock signal. The second data register acquires the parallel data from the first register according to the second working clock signal. The delay controller delays the second working clock signal to produce a third working clock signal. Finally, the third data register obtains the parallel data from the second register according to the third working clock signal.

17 Claims, 5 Drawing Sheets

SERIAL/PARALLEL DATA CONVERSION APPARATUS AND METHOD THEREOF

BACKGROUND OF THE INVENTION

1. Field of the Invention

The present invention is related to a serial/parallel data conversion apparatus and a method thereof, and more particularly to an apparatus for converting serial data into parallel data by using delay pulse and three stage registers and a method thereof.

2. Description of Related Art

Please refer to FIG. 1, which is a block diagram showing the circuit of conventional serial to parallel conversion device. In the conventional serial to parallel conversion device 1, the circuit designed for converting the serial data into the parallel data always adopts shift register 10, which includes multiple flip flops 102. The serial data SD0-SD6 are driven by serial working clock signal serial_clk of high frequency (Mbps or Gbps) and then stored into the flip flops 102 of the shift register 10 and simultaneously submitted to output terminals Q0-Q6 of the flip flops 102.

Please also refer FIG. 2. The clock signal generator 11 generates a parallel working clock signal parallel_clk according to the serial working clock signal serial_clk, wherein the serial data SD0-SD6 with the last serial data SD7 are driven by the parallel working clock signal parallel_clk and then stored in a parallel register 12, which is next to the shift register 10, and simultaneously submitted to output terminals Q0-Q7 of the parallel register 12 so as to form parallel data PD0-PD7.

However, since the conversion from serial data SD0-SD7 to parallel data PD0-PD7 is operated under high frequency, the high operation frequency might make the parallel register 12, which is next to the shift register 10, difficult to realize the logic operation, so as to cause non-logic operation between the shift register 10 and the parallel register 12, which includes multiple flip flops 122. At the same time, the parallel data PD0-PD7 outputted by the shift register 10 are only stored in the parallel register 12 and can not be delivered to the register next to the parallel register 12 since there is no additional clock signal inputted for outputting data from the parallel register 12.

Therefore, when converting from serial data SD0-SD7 to parallel data Pd0-PD7, if the additional serial working clock signal serial_clk is not inputted, the operation frequency of the register (parallel register 12) next to the shift register 10 can not be reduced, so that the frequency of the shift register 10 will become too high, and thus, the shift register 10 and the parallel register 12 will need an additional clock signal, or the parallel data PD0-PD7 will be stored in the parallel register 12 and not be delivered to the register next to the parallel register 12.

SUMMARY OF THE INVENTION

Consequently, the present invention provides a serial/parallel data conversion apparatus and a method thereof, wherein a delay pulse and three stage registers are utilized to convert serial data into parallel data without additionally inputting serial working clock signal, so as to lower down the operation frequency at the parallel terminal.

The present invention provides a serial/parallel data conversion apparatus including a first data register, a second data register, a third data register, a frequency divider and a delay controller. The first data register stores serial data as parallel data according to a first working clock signal, and at the same, the frequency divider receives the first working clock signal and outputs a second working clock signal. The second data register which is connected to the first data register and the frequency divider draws the parallel data according to the second working clock signal. The delay controller which is connected to the frequency divider delays the second working clock signal and outputs a third working clock signal. The third data register which is connected to the second data register and the delay controller draws the parallel data according to the third working clock signal.

The present invention also provides a serial/parallel data conversion method including steps of converting serial data to parallel data according to a first working clock signal and storing the parallel data in a first data register, performing a frequency division for the first working clock signal so as to produce a second working clock signal, retrieving the parallel data according to the second working clock signal and storing the parallel data in a second data register, performing a delay operation for the second working clock signal so as to produce a third working clock signal, and retrieving the parallel data according to the third working clock signal and storing the parallel data in a third data register.

Therefore, the present invention utilizes the frequency divider to lower the operation frequency of the parallel terminal and also utilizes the delay pulse provided by the delay controller to complete data conversion without inputting additional serial working clock signal.

BRIEF DESCRIPTION OF THE DRAWINGS

The foregoing aspects and many of the attendant advantages of this application will be more readily appreciated as the same becomes better understood by reference to the following detailed description, when taken in conjunction with the accompanying drawings, wherein.

DETAILED DESCRIPTION OF PREFERRED EMBODIMENTS

Figure 1:
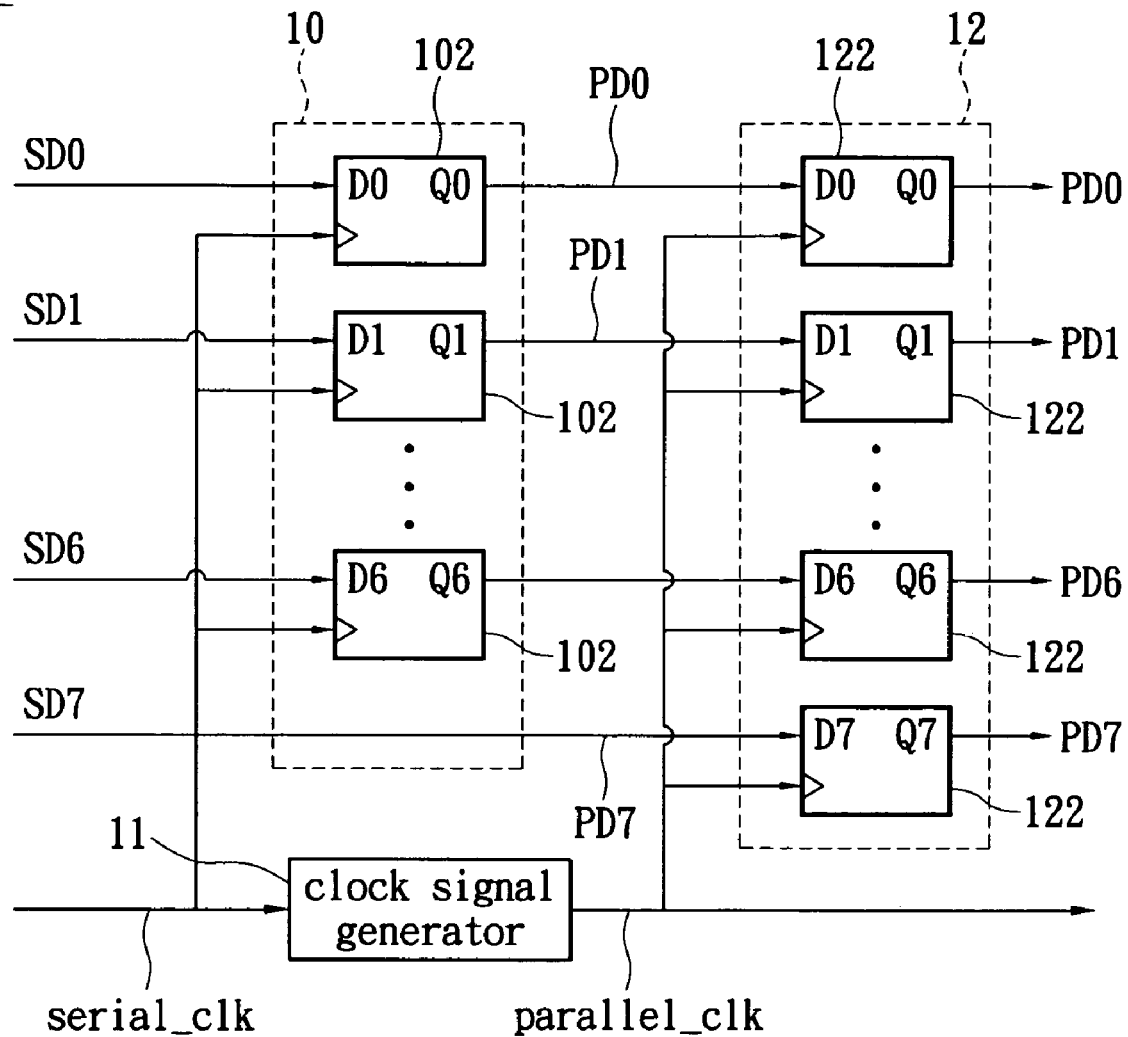
FIG. 1 is a block diagram showing the conventional serial to parallel conversion device.
Figure 2:
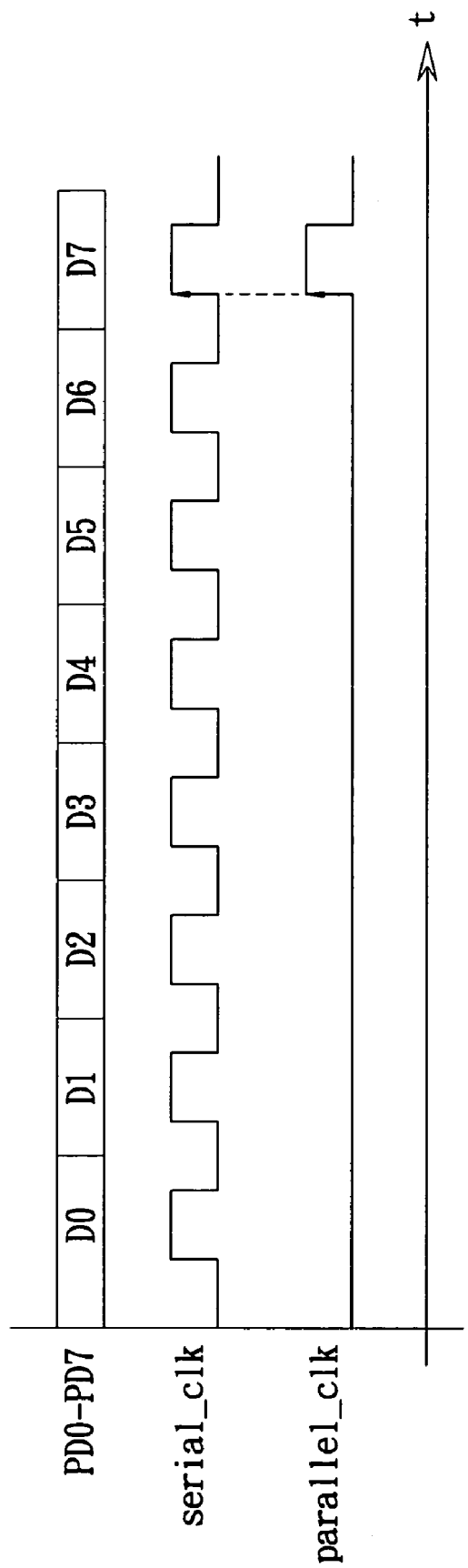
FIG. 2 is a schematic view showing clock signals of the prior art.
Figure 3:
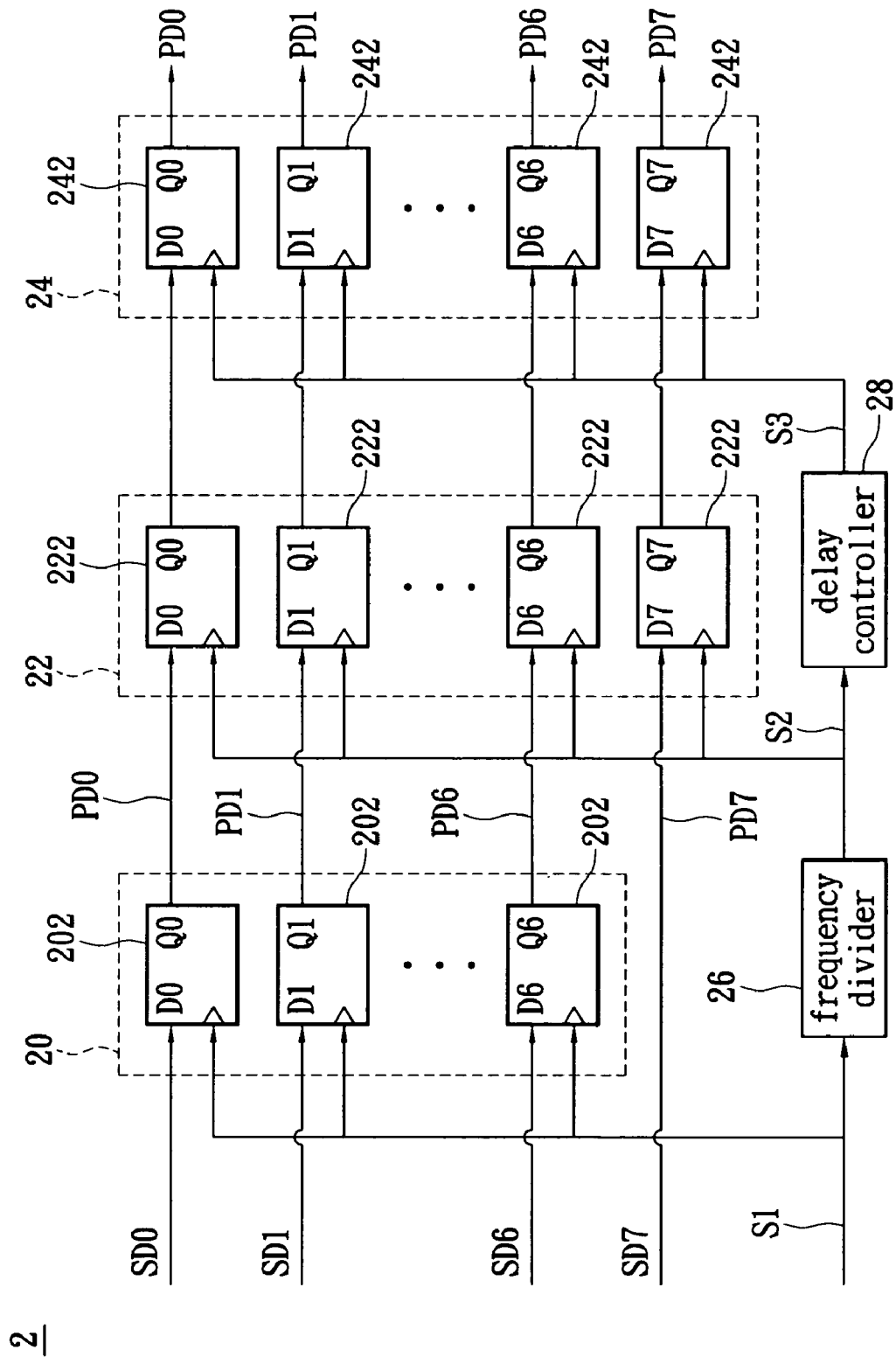
FIG. 3 is a block diagram showing the circuits of a serial/parallel data conversion apparatus according to the present invention.

Please refer to FIG. 3, which is a block diagram showing the circuits of a serial/parallel data conversion apparatus according to the present invention. The serial/parallel data conversion apparatus 2 includes a first data register 20, a second data register 22, a third data register 24, a frequency divider 26 and a delay controller 28. The first data register 20 stores serial data SD0-SD7 as parallel data PD0-PD7 according to a first working clock signal S1, and at the same, the frequency divider 26 receives the first working clock signal S1 and outputs a second working clock signal S2. The second data register 22, which is connected to the first data register 20 and the frequency divider 26, draws the parallel data PD0-PD7 according to the second working clock signal S2. The delay controller 28, which is connected to the frequency divider 26, delays the second working clock signal S2 and outputs a third working clock signal S3. The third data register 24, which is connected to the second data register 22 and the delay controller 28, draws the parallel data PD0-PD7 according to the third working clock signal S3 and submits the parallel data PD0-PD7 to the output terminal of the third data register 24.

In the present invention, suppose the parallel data has n bits, the first data register 20 will be a shift register constituted by n−1 first flip flop 202, the second data register 22 will be a buffer register constituted by n second flip flop 222, and the third data register 24 will be a parallel register constituted by n third flip flop 242. If n=8, the first flip flop 202, the second flip flop 222 and the third flip flop 242 will form a D-type flip flop.

Figure 4:
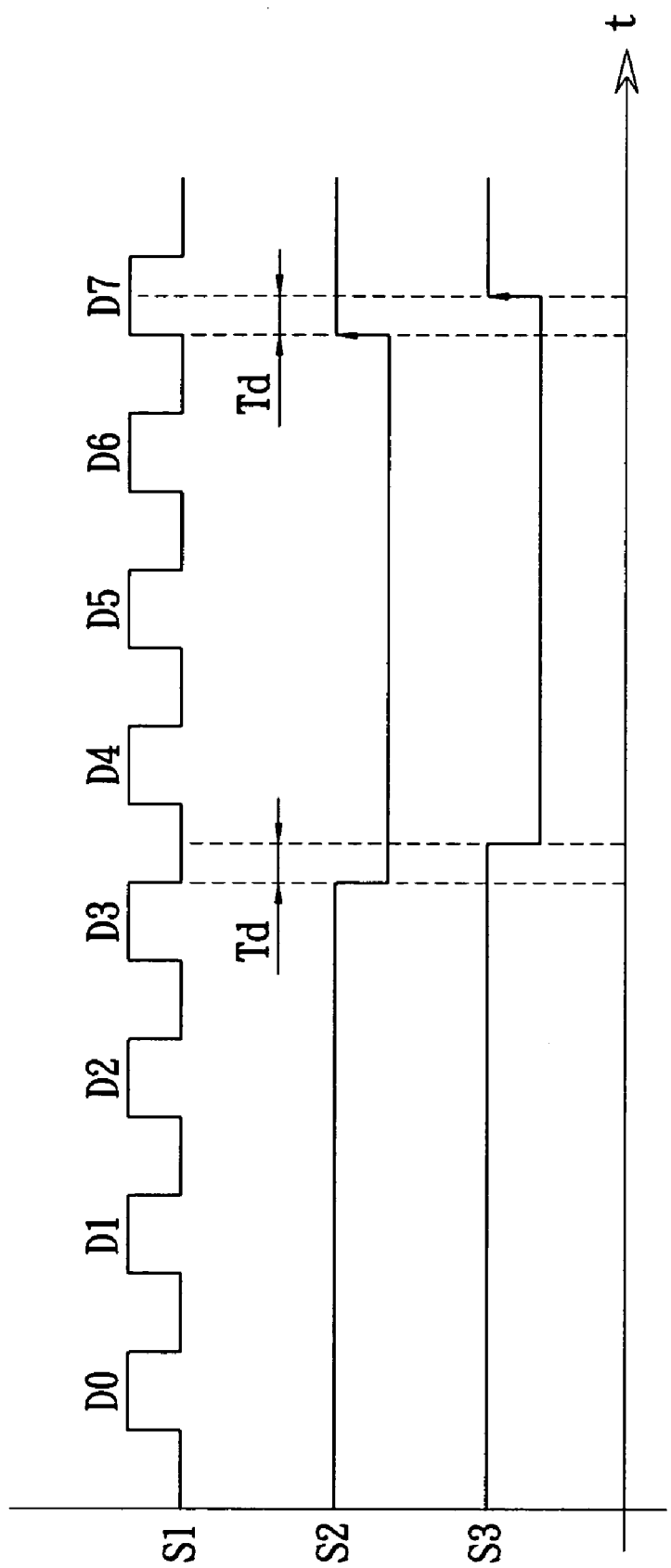
FIG. 4 is a schematic view showing the clock signals according to the present invention.

Please also refer to FIG. 4, which is a schematic view showing clock signals according to the present invention. The frequency divider 26 performs a frequency division for the first working clock signal S1 so as to lower down the first working clock signal S1 to the second working clock signal of n-multiple frequency and output thereof. Simultaneously, the delay controller 28 performs a delay operation for the second working clock signal S2 so as to produce the third working clock signal S3, wherein the third working clock signal S3 delays the second working clock signal S2 for a delay time Td.

At the same time, in the first data register 20, n−1 flip flop 202 is controlled by the rising edge of the first working clock signal S1 and stores the serial data Sd0-SD6 in turn and submits parallel data PD0-PD6 to the output terminals Q0-Q6, wherein the serial data Sd0-SD6 with the last serial data SD7 of the first working clock signal S1 form the parallel data PD0-PD7.

Moreover, in the second data register 22, the input terminals D0-D6 of n−1 second flip flop 222 which are connected to the output terminals D0-D6 of n−1 first flip flop 202 of the first data register 20 receives parallel PD0-PD6, and at the same time, the input terminal D7 of the second data register 22 which is not connected to the first data register 20 directly acquires the last serial data PD7 of the first working clock signal S1. Furthermore, n second flip flop 222 in the second data register 22 is controlled by the rising edge of the second working clock signal S2, which is n-multiple frequency lower than the first working clock signal S1, for retrieving the parallel data PD0-PD7. Besides, the parallel data PD0-PD7 is submitted to the output terminals Q0-Q7 of the second data register 22.

As shown in FIGS. 3 and 4, in the third data register 24, the input terminals D0-D7 of n third flip flop 242 which are connected to the output terminals D0-D7 of n second flip flop 222 in the second data register 22 receives parallel data PD0-PD7. Furthermore, n third flip flop 242 in the third data register 24 is controlled by the rising edge of the third working clock signal S3, for retrieving the parallel data PD0-PD7. Besides, the parallel data PD0-PD7 is submitted to the output terminals Q0-Q7 of the third data register 24.

Therefore, the data conversion apparatus 2 of the present invention, at first, utilizes the first working clock signal S1 and the first data register 20 to collect the serial data SD0-SD7. Then, when the collection is completed, the frequency divider 26 produces the second working clock signal S2 according to the first working clock signal S1 so as to update the data in the first data register 20 to the second data register 22. At this time, the serial data SD0-SD7 is converted into the parallel data PD0-PD7.

Moreover, in consideration of the set time and the hold time of the flip flop, the delay controller 28 properly delays the second working clock signal S2 for a delay time Td for producing the third working clock signal S3. The third working clock signal S3 is used to control the third data register 24 to draw the parallel data PD0-PD7 outputted by the second data register 22. Then, the third working clock signal S3 has a margin time to operate the parallel data PD0-PD7 outputted by the second data register 22.

Figure 5:
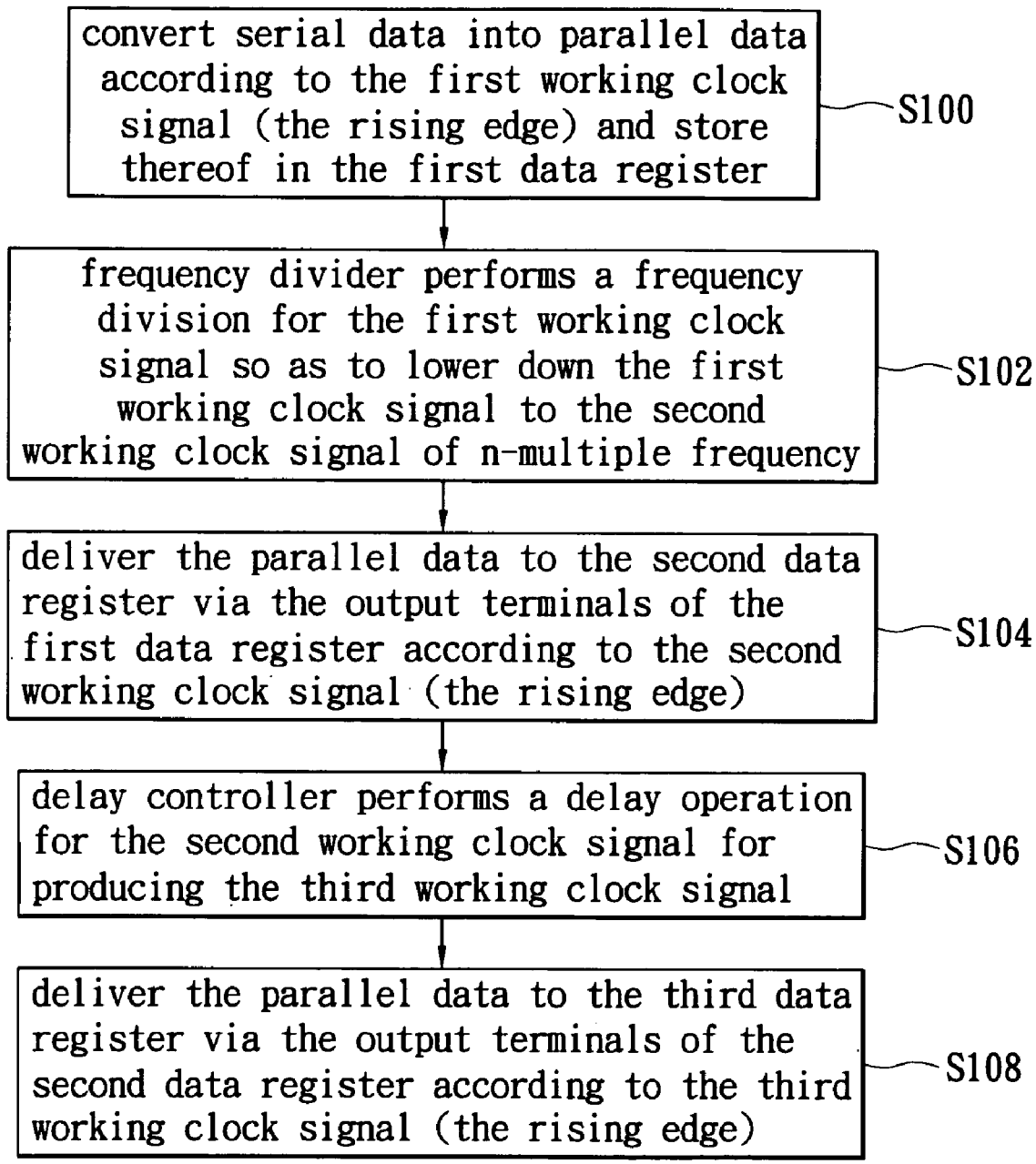
FIG. 5 is a flow chart showing a serial/parallel data conversion method according to the present invention.

Please refer to FIG. 5, which describes the conversion method of the present invention. First, according to the first working clock signal S1 (the rising edge), the serial data is converted into n bit parallel data (S100). At this time, the parallel data is stored in the first data register 20 and is also submitted to the output terminals of the first data register 20. Then, the frequency divider 26 performs the frequency division for the first working clock signal S1, so as to lower down the first working clock signal S1 to the second working clock signal S2 of n-multiple frequency (S102). Continuously, according to the second working clock signal S2 (the rising edge), the parallel data is delivered to the second data register 22 via the output terminals of the first data register 20 (S104) and is also submitted to the output terminals of the second data register 22.

Furthermore, the delay controller 28 performs a delay operation for the second working clock signal S2 for producing the third working clock signal S3 (S106). Finally, according to the third working clock signal S3 (the rising edge), the parallel data is delivered to the third data register 24 via the output terminals of the second data register 22 (S108) and is also submitted to the output terminals of the third data register 24.

In the aforesaid, the serial/parallel data conversion apparatus 2 provided by the present invention utilizes a frequency divider to lower the operation frequency of the parallel terminal, and at the same time, also utilizes a delay pulse provided by the delay controller to complete the conversion. Therefore, through the delay pulse and the three stage registers, the serial/parallel data conversion according to the present invention not only doesn't need additional serial working clock signal, but also can lower down the operation frequency at the parallel terminal and complete the data conversion.

It is to be understood, however, that even though numerous characteristics and advantages of the present application have been set forth in the foregoing description, together with details of the structure and function of the application, the disclosure is illustrative only, and changes may be made in detail, especially in matters of shape, size, and arrangement of parts within the principles of the application to the full extent indicated by the broad general meaning of the terms in which the appended claims are expressed.

What is claimed is:

1. A serial/parallel data conversion apparatus, comprising:
    a first data register, storing serial data as parallel data according to a first working clock signal;
    a frequency divider, for receiving the first working clock signal and performing a frequency division for the first working clock signal so as to output a second working clock signal;
    a second data register, connected to the first data register and the frequency divider, for retrieving the parallel data according to the second working clock signal;
    a delay controller, connected to the frequency divider, for delaying the second working clock signal so as to output a third working clock signal; and
    a third data register, connected to the second data register and the delay controller, for retrieving the parallel data according to the third working clock signal.

2. The serial/parallel data conversion apparatus as claimed in claim 1, wherein the parallel data is n bit parallel data, and the first data register is constituted by an n−1 first flip flop.

3. The serial/parallel data conversion apparatus as claimed in claim 2, wherein the n−1 first flip flop is controlled by the rising edge of the first working clock signal and converts the serial data into the parallel data in turn.

4. The serial/parallel data conversion apparatus as claimed in claim 3, wherein the first flip flop is a D-type flip flop.

5. The serial/parallel data conversion apparatus as claimed in claim 2, wherein the frequency divider lowers the first working clock signal to the second working clock signal of n-multiple frequency.

6. The serial/parallel data conversion apparatus as claimed in claim 5, wherein the second data register is constituted by an n second flip flop, and the input terminals of the n−1 second flip flop are connected to the output terminal of the n−1 first flip flop.

7. The serial/parallel data conversion apparatus as claimed in claim 6, wherein the n second flip flop is controlled by the rising edge of the second working clock signal so as to draw the parallel data.

8. The serial/parallel data conversion apparatus as claimed in claim 7, wherein the second flip flop is a D-type flip flop.

9. The serial/parallel data conversion apparatus as claimed in claim 6, wherein the third data register is constituted by an n third flip flop, and input terminals of the n third flip flop are connected to the output terminal of the n second flip flop.

10. The serial/parallel data conversion apparatus as claimed in claim 9, wherein the n third flip flop is controlled by the rising edge of the third working clock signal so as to draw the parallel data.

11. The serial/parallel data conversion apparatus as claimed in claim 10, wherein the third flip flop is a D-type flip flop.

12. A serial/parallel data conversion method, comprising steps of:
    converting serial data to parallel data according to a first working clock signal and storing the parallel data in a first data register;
    performing a frequency division for the first working clock signal so as to produce a second working clock signal;
    retrieving the parallel data according to the second working clock signal and storing the parallel data in a second data register;
    performing a delay operation for the second working clock signal so as to produce a third working clock signal; and
    retrieving the parallel data according to the third working clock signal and storing the parallel data in a third data register.

13. The method as claimed in claim 12, wherein the parallel data is n bit parallel data.

14. The method as claimed in claim 13, wherein the step of converting references to the rising edge of the first working clock signal.

15. The method as claimed in claim 13, wherein the retrieving of the parallel data references to the rising edge of the second working clock signal.

16. The method as claimed in claim 13, wherein the retrieving of the parallel data references to the rising edge of the third working clock signal.

17. The method as claimed in claim 13, wherein the frequency division is to lower the first working clock signal to the second working clock signal of n-multiple frequency.

* * * * *